(12) United States Patent
Cherniak et al.

(10) Patent No.: US 11,418,199 B1
(45) Date of Patent: Aug. 16, 2022

(54) PHASE LOCKED LOOP WITH PARALLEL PHASE DETECTION CIRCUITS

(71) Applicants: Infineon Technologies AG, Neubiberg (DE); Politecnico Di Milano, Milan (IT)

(72) Inventors: Dmytro Cherniak, Villach (AT); Salvatore Levantino, Mailand (IT); Alessio Santiccioli, Castiglion Fiorentino (IT)

(73) Assignees: INFINEON TECHNOLOGIES AG, Neubiberg (DE); POLITECNICO DI MILANO, Milan (IT)

( * ) Notice: Subject to any disclaimer, the term of this patent is extended or adjusted under 35 U.S.C. 154(b) by 0 days.

(21) Appl. No.: 17/327,049

(22) Filed: May 21, 2021

(51) Int. Cl.
   *H03L 7/087* (2006.01)
   *H03L 7/099* (2006.01)
   *H04L 7/033* (2006.01)

(52) U.S. Cl.
   CPC .............. *H03L 7/087* (2013.01); *H03L 7/099* (2013.01); *H04L 7/0331* (2013.01)

(58) Field of Classification Search
   CPC ......... H03L 7/087; H03L 7/089; H03L 7/091; H03L 7/099; H03L 7/0991; H03L 2207/50; H04L 7/0331
   See application file for complete search history.

(56) References Cited

U.S. PATENT DOCUMENTS 7,888,973 B1 * 2/2011 Rezzi .................... H03L 7/197
                                                              327/105

OTHER PUBLICATIONS

Chang, Wei-Sung et al., "A Fractional-N Divider-Less Phase-Locked Loop With a Subsampling Phase Detector", IEEE Journal of Solid-State Circuits, vol. 49, No. 12, Dec. 2014, 12 pages.

Cherniak, Dmytro et al., "A 23-GHz Low-Phase-Noise Digital Bang-Bang PLL for Fast Triangular and Sawtooth Chirp Modulation", IEEE Journal of Solid-State Circuits, vol. 53, No. 12, Dec. 2018, 11 pages.

Ek, Staffan et al., "A 28-nm FD-SOI 115-fs Jitter PLL-Based LO System for 24-30-GHz Sliding-IF 5G Transceivers", IEEE Journal of Solid-State Circuits, vol. 53, No. 7, Jul. 2018, 13 pages.

Iotti, Lorenzo et al., "Insights Into Phase-Noise Scaling in Switch-Coupled Multi-Core LC VCOs for E-Band Adaptive Modulation Links", IEEE Journal of Solid-State Circuits, vol. 52, No. 7, Jul. 2017, 16 pages.

Levantino, Salvatore, "Digital Phase-Locked Loops", Politecnico Milano 1863, San Diego, Apr. 8, 2018, 79 pages.

(Continued)

*Primary Examiner* — Diana J. Cheng
(74) *Attorney, Agent, or Firm* — Slater Matsil, LLP

(57) ABSTRACT

In accordance with an embodiment, a method of operating a phase locked loop (PLL), the method including: comparing a phase of a reference signal with a phase of a clock signal using a plurality of parallel matched phase detection circuits to provide a plurality of phase detection signals, where each of the plurality of the parallel matched phase detection circuits is configured to have a same phase difference to output characteristic; filtering a sum of the plurality of phase detection signals to form a filtered phase detection signal; and controlling a frequency of an oscillator using the filtered phase detection signal, where the oscillator is configured to provide the clock signal.

20 Claims, 10 Drawing Sheets

(56) References Cited

OTHER PUBLICATIONS

Padovan, Fabio et al., "A Quad-Core 15GHz BiCMOS VCO with -124dBc/Hz Phase Noise at 1MHz Offset, -189dBc/Hz FOM, and Robust to Multimode Concurrent Oscillations", ISSCC /Session 23 / Lo Generation / 23.6, Feb. 4, 2018, 3 pages.
Dellerano, Stefano et al., "A4.75-GHz Fractional Frequency Divider-by-1.25 With TDC-Based All Digital Spur Calibration in 45 nm Cmos", IEEE Journal of Solid State Circuits, vol. 44, No. 12, Dec. 2009, 12 pages.
Seong, Taeho et al., "A 320-fs RMS Jitter and -75-dBc Reference-Spur Ring-DCO-Based Digital PLL Using an Optimal-Threshold TDC", IEEE Journal of Solid-State Circuits, vol. 54, No. 9, Sep. 2019, 12 pages.

\* cited by examiner

PHASE LOCKED LOOP WITH PARALLEL PHASE DETECTION CIRCUITS

TECHNICAL FIELD

The present invention relates generally to a system and method for a phase locked loop (PLL), and, in particular embodiments, to a system and method for PLL with parallel phase detection circuits.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar systems and multi-gigabit communication systems.

One of the key components in a millimeter-wave system is a PLL used to tune a radio frequency (RF) oscillator. Essentially, the PLL is a feedback loop that receives a clock signal of a relatively low frequency and tunes the RF oscillator to have a frequency that is a predetermined multiple of the clock signal frequency. PLLs generally include an RF oscillator that provides a high frequency periodic signal, a divider circuit that divides the high frequency periodic into a lower frequency signal, a phase detector that compares the phase of lower frequency signal with a phase of a reference clock, and a loop filter that filters the output of the phase detector to provide a signal used to tune the RF oscillator.

During operation, the PLL loop provides a lowpass characteristic to phase noise present in the reference path (e.g. noise due to the reference clock and phase detector), and provides a highpass characteristic to phase noise generated by the oscillator. Thus, at frequencies below the PLL bandwidth, the PLL attenuates oscillator phase noise and passes reference path noise, and at frequencies above the PLL bandwidth, the PLL attenuates reference path noise and passes oscillator phase noise. It is therefore very common to configure a PLL with a low bandwidth in systems where low phase noise oscillators are available. In this manner, a relatively high amount of reference path noise can be rejected over a wide range of frequencies in exchange for allowing the noise of a relatively quiet oscillator to dominate.

However, RF oscillators having a low phase noise characteristic are difficult to design at millimeter wave frequencies due to degraded capacitor quality factors and increased parasitics at these high frequencies. Increased phase noise performance at millimeter wave frequencies often comes at the expense of increased power consumption and increased chip area. One way to reduce the amount of PLL phase generated by an RF oscillator is to control the frequency of the oscillator using PLL having a high bandwidth. However, increasing the bandwidth of a PLL comes at the expense of a corresponding increase in reference path noise.

SUMMARY

In accordance with an embodiment, a method of operating a phase locked loop (PLL), the method including: comparing a phase of a reference signal with a phase of a clock signal using a plurality of parallel matched phase detection circuits to provide a plurality of phase detection signals, where each of the plurality of the parallel matched phase detection circuits is configured to have a same phase difference to output characteristic; filtering a sum of the plurality of phase detection signals to form a filtered phase detection signal; and controlling a frequency of an oscillator using the filtered phase detection signal, where the oscillator is configured to provide the clock signal.

In accordance with another embodiment, a phase locked loop (PLL) including: a plurality of parallel matched phase detection circuits, each of the plurality of parallel matched phase detection circuits including a first input coupled to a reference signal node, a second input coupled to a clock signal node, and an output configured to provide a respective phase detection signal, where each of the plurality of the parallel matched phase detection circuits is configured to have a same phase difference to output characteristic; a loop filter coupled to outputs of the plurality of parallel matched phase detection circuits; and an oscillator having a frequency control input coupled to an output of the loop filter, where the oscillator is configured to provide a clock signal.

In accordance with a further embodiment, a phase locked loop (PLL) including: a plurality of phase detection signal paths coupled in parallel, each phase detection signal path including a digital-to-time converter and a time-to-digital converter having an input coupled to an output of the digital-to-time converter, where each of the plurality of phase detection signal paths are configured to apply a same phase detection characteristic to a phase difference between a reference signal and a divided clock signal; a summing circuit coupled to outputs of each of the plurality of phase detection signal paths; a digital loop filter coupled to an output of the summing circuit; a digitally controlled oscillator (DCO) coupled to an output of the digital loop filter; a divider coupled between an output of the DCO and the plurality of phase detection signal paths, the divider configured to provide the divided clock signal; a delta-sigma modulator having an output coupled to modulo control input of the divider; and a subtraction circuit having input coupled to an input of the delta-sigma modulator and the output of the delta-sigma modulator and an output coupled to a delay control input of each digital-to-time converter of the plurality of phase detection signal paths.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a PLL includes a two or more parallel matched phase detection circuits. By using parallel matched phase detection circuits, the amount of input referred noise generated by the phase detection function of the PLL can be reduced compared to the use of a single phase detection circuit.

Figure 1A:
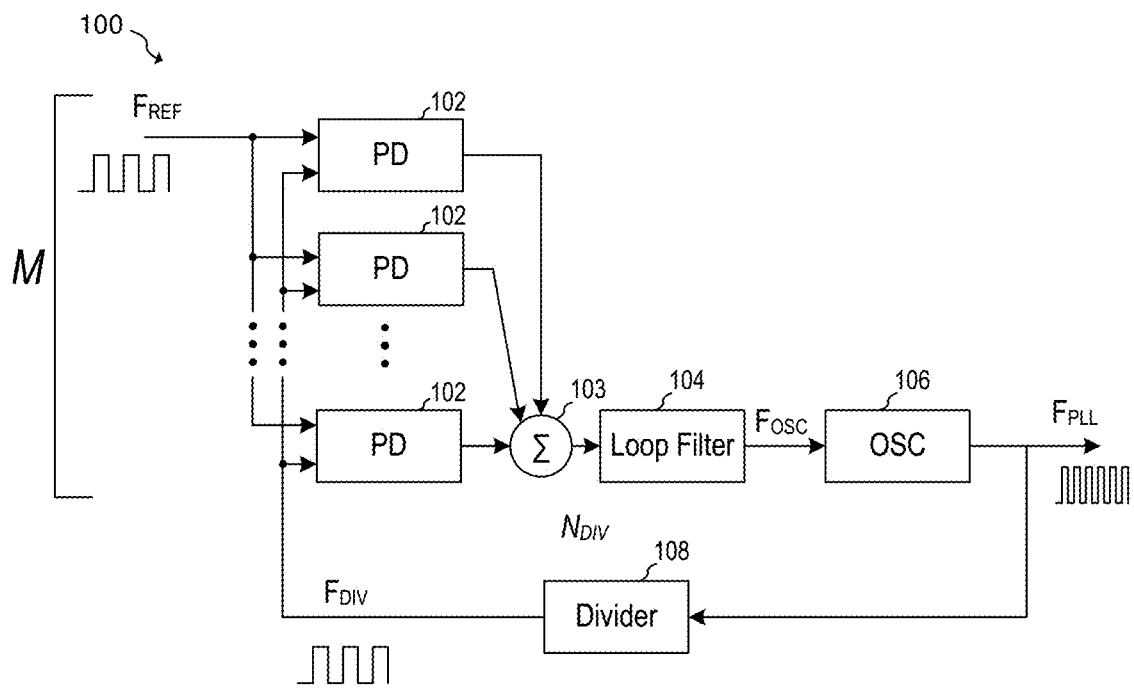
FIG. 1A illustrates a block diagram of a PLL according to an embodiment.

FIG. 1A illustrates a PLL 100 according to an embodiment of the present invention. As shown PLL 100 includes M phase detection circuits 102 coupled in parallel, a loop filter 104, an oscillator 106, and a clock divider 108. During operation, each phase detection circuit 102 compares the phase of reference signal $F_{REF}$ with the phase of divided clock $F_{DIV}$ to form a plurality of phase comparison signals, which are combined by summer 103 and further filtered by loop filter 104. In some embodiments, the reference signal $F_{REF}$ may be referred to as "reference clock $F_{REF}$", the reference clock input to phase detection circuit 102 may be referred to as a "reference signal node," and the divided clock signal input to phase detection circuit 102 may be referred to as a "clock signal node," and the phase comparison signals may be referred to as "phase detection signals." In various embodiments, the M phase detection circuits 102 are matched to each other and are configured to have a same phase difference to output characteristic. For example, each of the M phase detection circuits 102 may have the same input to output characteristic, such as a same input phase difference to output variable characteristic. The output variable may include, but is not limited to a voltage, a current or a digital code. Accordingly, the outputs of phase detection circuits 102 may be combined using a voltage summer or digital adder, which is represented by summer 103. Phase detection circuits 102 may be nominally designed to be identical.

A frequency control signal $F_{OSC}$ produced by loop filter 104 is used to control the frequency of oscillator 106, which produces output signal $F_{PLL}$. In some embodiments, PLL 100 may be implemented as an analog PLL where phase detection circuit 102 is implemented using a phase-frequency detector (PFD) and a charge pump, loop filter 104 is implemented using an analog filter, such as an RC filter, and oscillator 106 is implemented using an oscillator having an analog frequency control input, such as a voltage controlled oscillator (VCO) as is discussed below with respect to FIG. 2A. In other embodiments, PLL 100 may be implemented as an all-digital PLL (ADPLL) in which phase detector 102 is implemented using a time-to-digital converter (TDC), loop filter 104 is implemented using a digital filter, and oscillator 106 is implemented using a digitally controlled oscillator (DCO) as discussed below with respect to FIGS. 3A and 3C to 3F. Clock divider 108 divides the frequency of $F_{PLL}$ by a factor of $N_{DIV}$. Thus, the output frequency $f_{PLL}$ of PLL 100 can be expressed as:

$$f_{PLL}=N_{DIV} \cdot f_{REF},$$

where $f_{REF}$ is the frequency of reference clock $F_{REF}$. In various embodiments, clock divider 108 can be implemented as an integer divider, a fractional divider a counter, or a prescaler coupled in series with a fractional divider as discussed below with respect to FIGS. 3A and 3C. In some embodiments, clock divider 108 may be omitted and/or output frequency $f_{PLL}$ of PLL 100 may be adjusted using divider-less fractional-N PLL circuits and methods known in the art as discussed in embodiments below with respect to FIG. 3D.

In various embodiments, using parallel phase detector circuits reduces the noise generated by the phase detection function of the PLL. In general, having M phase detector circuits 102 coupled in parallel results in a $\sqrt{M}$ reduction in noise power contributed by the phase detection function of the PLL compared to having a single phase detection circuit 102. Each phase detection circuit 102 may have substantially the same threshold and/or the same output vs phase characteristic. In some embodiments, the relative delays between each phase may be calibrated to ensure that the delay path through each phase detector is matched.

Figure 1B:
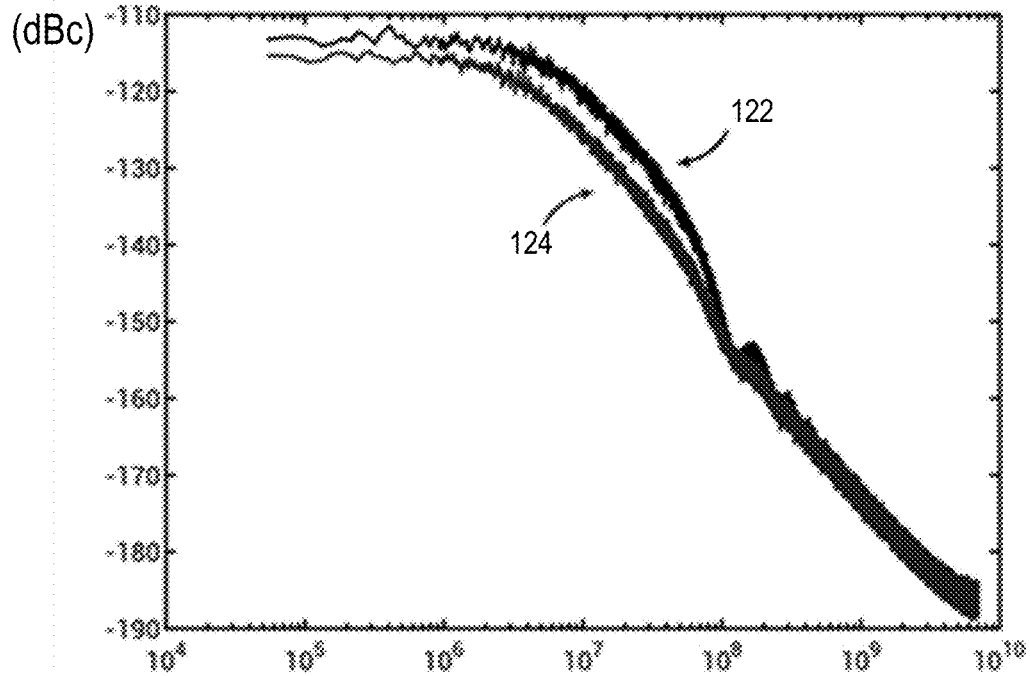
FIG. 1B illustrates a graph comparing the phase noise performance of an embodiment PLL and a conventional PLL.

FIG. 1B illustrates a simulated phase noise vs. frequency graph representing the phase nose contribution of phase detection circuits 102 for PLL 100 shown in FIG. 1A. Trace 122 represents the phase noise contribution of the phase detection function of PLL 100 with a single phase detection circuit 102 (e.g., M=1), and trace 124 represents the phase noise contribution of the phase detection function of PLL 100 with a two phase detection circuits 102 (e.g., M=2). As can be seen by the graph of FIG. 1B, trace 124 representing the PLL with two phase detection circuits 102 has a phase noise that is about 3 dB lower than trace 122 representing the PLL with a single phase detection circuit for frequencies within the PLL bandwidth (e.g., 3 MHz).

Figure 1C:
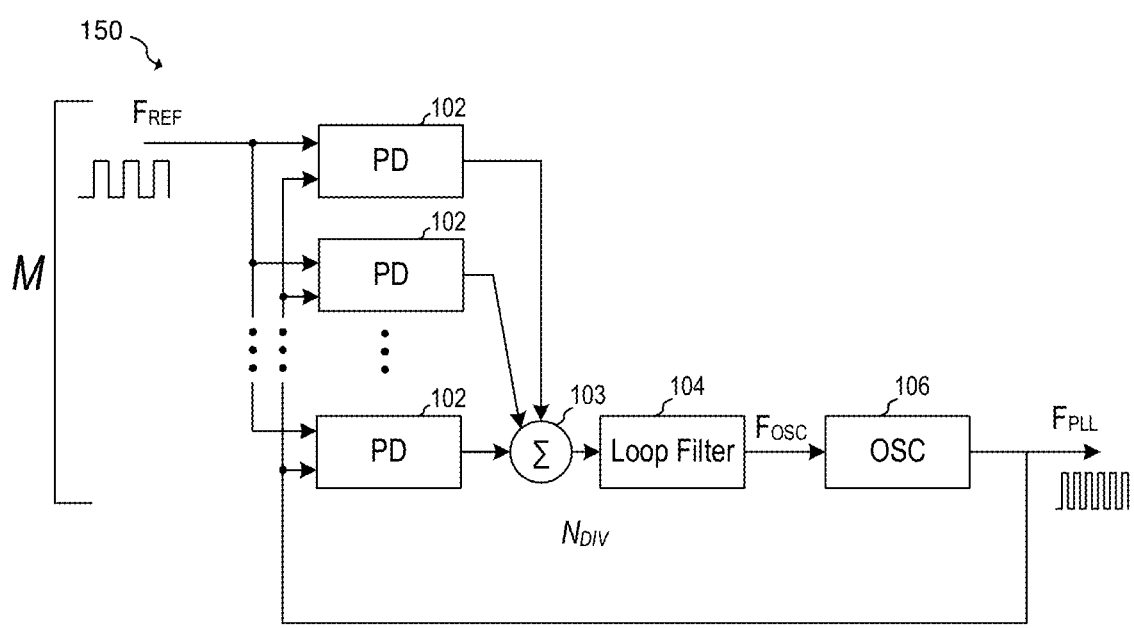
FIG. 1C illustrates a block diagram of a PLL according to a further embodiment.

An embodiment PLL may also be implemented as a "dividerless" PLL 150 as shown in FIG. 1C. PLL 150 is similar to PLL 100 illustrated in FIG. 1A, except that divider 108 is not used. Rather, PLL 150 operates according to principles of operation for dividerless PLLs known in the art, and may incorporate operation principles discussed below with respect to FIG. 3D.

Figure 2A:
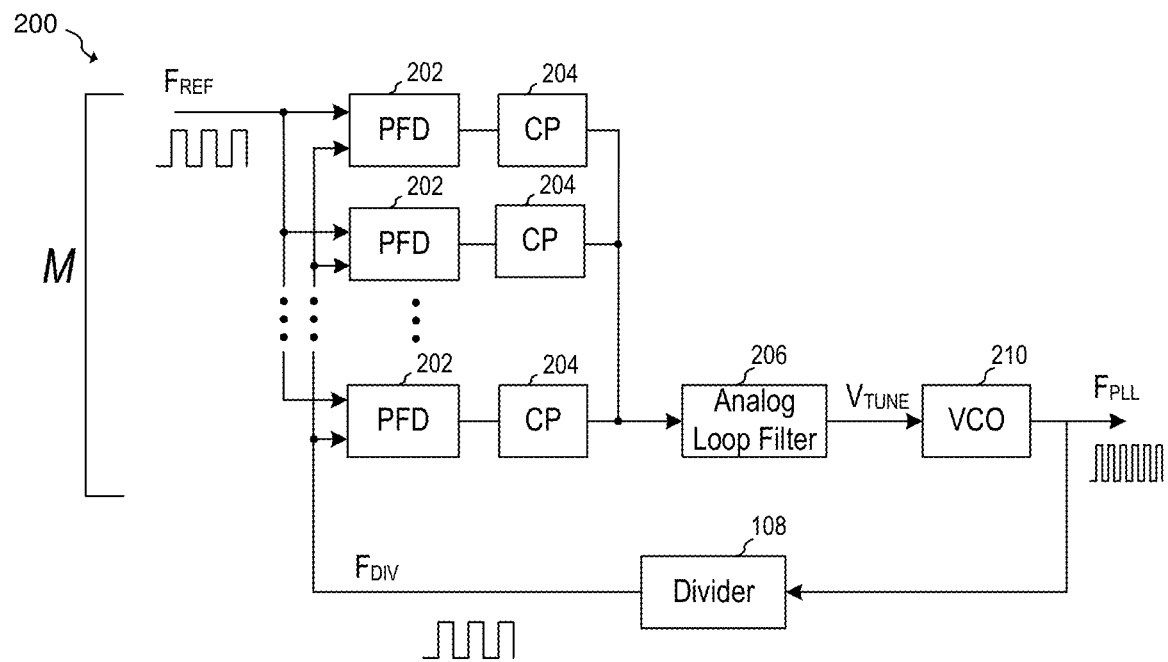
FIG. 2A illustrates a block diagram of an analog PLL according to an embodiment.

FIG. 2A illustrates a schematic of an analog PLL 200 that could be used to implement PLL 100 shown in FIG. 1A. As shown, each of M phase detection circuits 102 shown in FIG. 1A is implemented using a phase-frequency detector (PFD) 202 followed by a charge pump 204. Summer 103 shown in FIG. 1A is implemented by simply connecting the outputs of each respective charge pump 204 together so that their output currents sum together during operation. Loop filter 104 is implemented using an analog loop filter 206, and oscillator 106 is implemented using a voltage controlled oscillator (VCO) 210. During operation, analog loop filter 206 filters the summed output of charge pumps 204 to produce a tuning voltage $V_{TUNE}$.

Figure 2B:
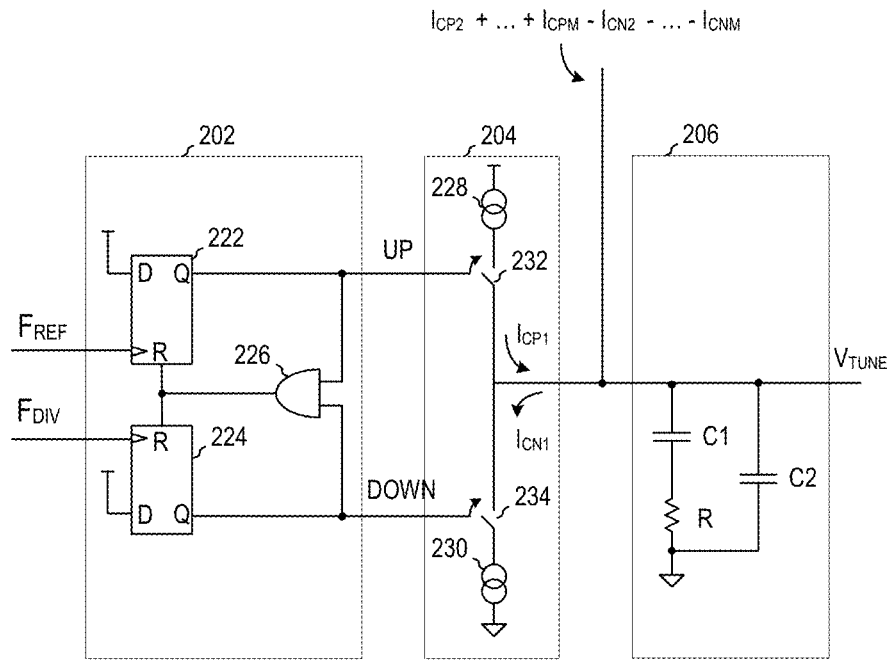
FIG. 2B illustrates a schematic of an embodiment phase detection signal path.

FIG. 2B illustrates a schematic of a possible implementation for PFD 202, charge pump 204, and analog loop filter 206. As shown, PFD 202 includes two D-type flip-flops 222 and 224 and AND gate 226. During operation, when reference clock signal $F_{REF}$ has a rising clock edge that precedes the rising clock edge of divided clock signal $F_{DIV}$, flip-flop 222 generates signal UP in response to the rising edge of reference clock signal $F_{REF}$. At the rising edge of divided clock signal $F_{DIV}$, the signal DOWN is momentarily generated by flip-flop 224. Once signals UP and DOWN are simultaneously asserted, AND gate 226 resets flip-flops 222 and 224. Similarly, when divided clock signal $F_{DIV}$ has a rising clock edge that precedes the rising clock edge of reference clock signal $F_{REF}$, flip-flip 224 generates signal DOWN in response to the rising edge of divided clock signal $F_{DIV}$. At the rising edge of reference clock signal $F_{REF}$, signal UP is momentarily generated by flip-flop 222. Once signals UP and DOWN are simultaneously asserted, AND gate 226 resets flip-lops 222 and 224. It should be understood that the implementation of PFD 202 shown in FIG. 2B is just one example of many possible PFD circuits that could be used to implement PFD 202. Logical and functional equivalents, as well as other PFD circuits known in the art, may also be used.

Charge pump 204 is represented with current sources 228 and 230 and switches 232 and 234. When signal UP is asserted, current $I_{CP1}$ generated by current source 228 flows to analog loop filter 206 via switch 232. Similarly, when signal DOWN is asserted, current $I_{CN1}$ is generated by current source 230 flows to analog loop filter 206 via switch 234. As shown the charge pump currents $I_{CP2}$ to $I_{CPM}$ and $I_{CN2}$ to $I_{CNM}$ of the remaining M−1 charge pumps are provided to loop filter 206 along with currents $I_{CP1}$ and $I_{CN1}$. The implementation of charge pump 204 shown in FIG. 2B is just one of many possible charge pump circuits that could be used to implement charge pump 204. Other charge pump circuits known in the art could also be used.

Analog loop filter 206 includes capacitor C1 and resistor R coupled in series, along with shunt capacitor C2. Other analog loop filter topologies could also be used in alternative embodiments.

Figure 3A:
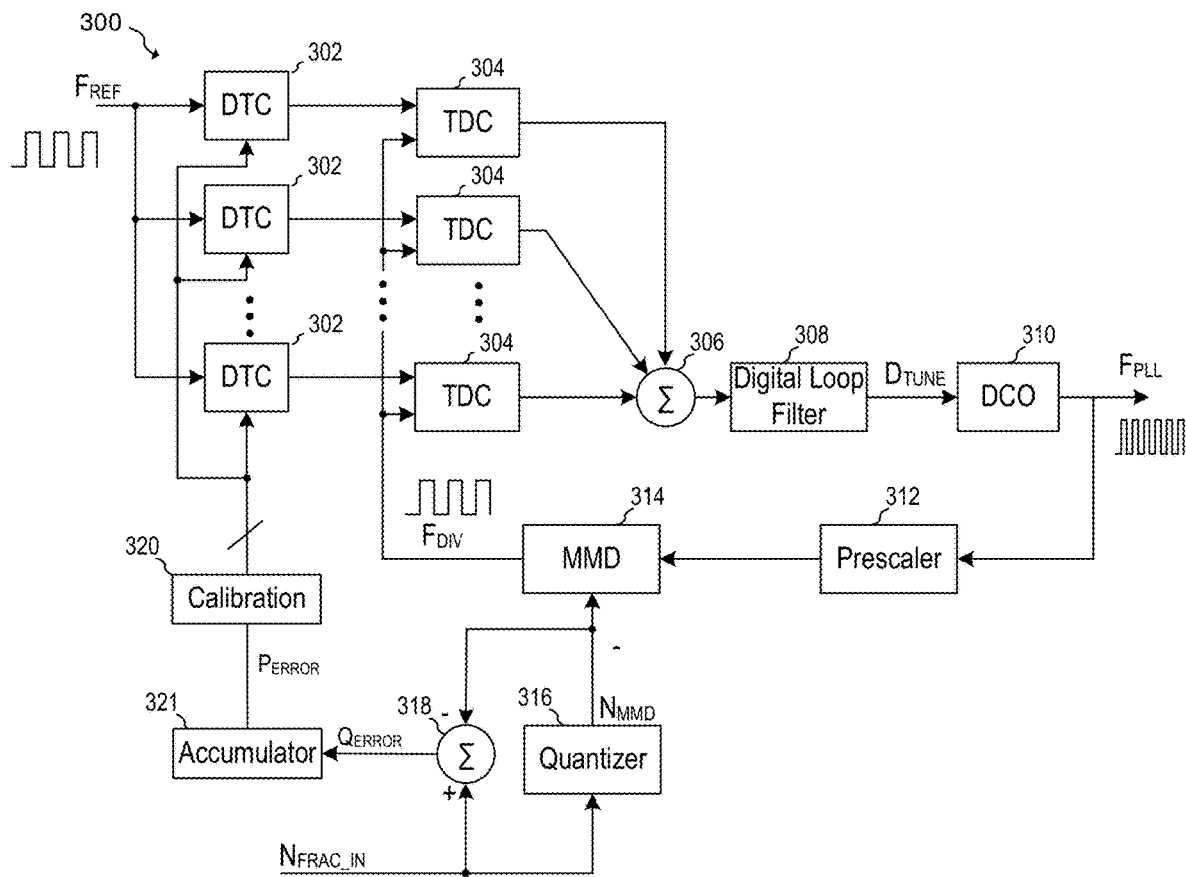
FIG. 3A illustrates an all-digital PLL according to an embodiment.

FIG. 3A illustrates a schematic of an embodiment all-digital PLL (ADPLL) 300 that can be used to implement PLL 100 shown in FIG. 1A. In an embodiment, the function of each phase detection circuit 102 shown in FIG. 1A is implemented using a time-to-digital converter (TDC) 304 coupled in series with a digital-to-time converter (DTC) 302 that is used to calibrate and equalize the delay of each phase detection path. In some embodiments, TDC 304 may be configured to provide a multi-bit output. Summer 103, loop filter 104 and oscillator 106 shown in FIG. 1A may be respectively implemented using a digital summer 306 (also referred to as a "summing circuit"), a digital loop filter 308 and a digitally controlled oscillator (DCO) 310. Clock divider 108 shown in FIG. 1A is implemented using a prescaler 312 coupled followed by a multi-modulus divider (MMD) 314.

TDCs 304 may be implemented using time-to-digital converter circuits and methods known in the art, for example, using a Vernier interpolator or a tapped delay line; digital loop filter 308 may be implemented using a digital filter known in the art, such as a first order IIR digital filter, and DCO 310 may be implemented using DCO structures known in the art, such as an active LC oscillator (e.g. negative resistance oscillator or Colpitts oscillator) having a digitally selectable LC tank capacitance. It should be understood that these implementations for TDC 304, digital loop filter 308 and DCO 310 are just a few of many possible implementation examples for these circuits.

In various embodiments, the division ratio of MMD 314 is controlled using a quantizer 316. As shown desired fractional division ratio $N_{FRAC\_IN}$ (also referred to as a "fractional division value" or a "fractional division input") is provided to quantizer 316, which provides an over-sampled modulated output $N_{MMD}$ to MMD 314 at a modulo control input. In various embodiments, quantizer 316 may be implemented using an oversampled modulator, such as a digital delta-sigma modulator. By using a delta-sigma modulator, the spurious energy generated by the changing division ratio of MMS may be spread over multiple frequencies and pushed to higher frequencies due to the noise shaping properties of the delta-sigma modulator. Depending on how the PLL is designed, much of this noise-shaped spurious energy may be pushed above the bandwidth of the PLL such that fractional spurs are significantly attenuated. For example, in one embodiment, a third-order multistage noise shaping (MASH) delta-sigma modulator architecture is used to implement quantizer 316. Alternatively, delta-sigma modulators of orders besides three and/or delta-sigma modulators having non-MASH architectures and/or successive re-quantizers may be used.

Each TDC 304 is associated with a corresponding DTC 302 configured to apply an adjustable delay to the reference clock signal $F_{REF}$ in order to compensate for the quantization error of quantizer 316. This delay may be set via a delay control input coupled to calibration circuit 320. In an embodiment, a quantization error signal $Q_{ERROR}$ is produced by subtracting the input $N_{MMD}$ of MMD 314 from the desired fractional division ratio $N_{FRAC\_IN}$ using digital subtractor 318 (also referred to as a "subtraction circuit" and a "quantization error determination circuit"). In an embodiment, $Q_{ERROR}$ is accumulated by accumulator 321 to generate a phase error signal $P_{ERROR}$ proportional to the phase error introduced by the quantizer 316. In various embodiments, the DTCs 302 produce a delay which corrects for this phase error represented by phase error signal $P_{ERROR}$ introduced by the quantizer 316. In various embodiments, less delay is provided by DTCs 302 when the accumulated quantization error signal $P_{ERROR}$ indicates that the output $F_{DIV}$ of the MMD has a larger delay with respect to the reference signal $F_{REF}$ and more delay is provided by DTCs 302 when the accumulated quantization error signal $P_{ERROR}$ indicates that the output $F_{DIV}$ of the MMD has a lower delay with respect to the reference signal $F_{REF}$. DTCs 302 may be implemented using digital-to-time converter circuits known in the art including, but not limited to selectable delay lines of varying delay lengths and inverter chains having digitally selectable capacitive loads.

In addition to providing a variable delay to compensate for the quantization error of quantizer 316, DTCs 302 may also be calibrated in order to equalize the delays of each phase detection signal path. In various embodiments, calibration circuit 320 may be configured to modify phase error signal $P_{ERROR}$ for each block in order to reduce or minimize relative phase errors in each phase detection path that includes DTC 302 and TDC 304. An example of how this calibration could be implemented is discussed below with respect to FIGS. 4A and 4B.

Figure 3B:
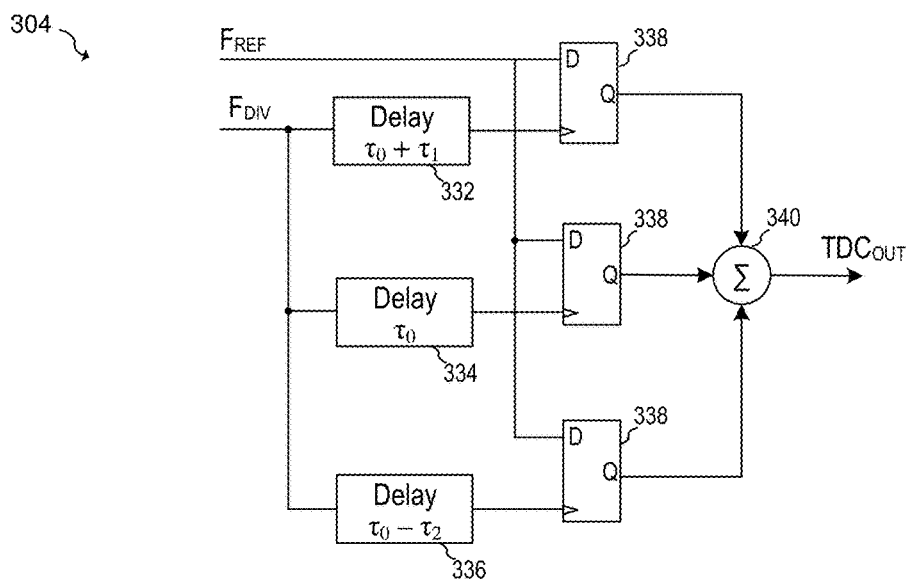
FIG. 3B illustrates a time-to-digital converter circuit.

FIG. 3B illustrates a schematic of an example time-to-digital converter circuit that could be used to implement TDC 304 shown in FIG. 3A. As shown, TDC 304 includes D-type flip-flops 222, digital summer 340, and delay blocks 332, 334 and 336. As shown delay block 332 has a delay of $\tau_o+\tau_1$, delay block 334 has a delay of $\tau_o$, and delay block 336 has a delay of $\tau_o+\tau_2$. Because each flip-flop 338 is clocked at various delayed times with respect to the rising edge of divided clock signal $F_{DIV}$, each flip-flop 338 samples the reference input clock $F_{FREF}$ at a different phase delay. Thus, the sum $TDC_{OUT}$ of all outputs of flip-flops 338 provided by summer 340 is dependent on the phase relationship between reference clock signal $F_{REF}$ and divided clock signal $F_{DIV}$. When reference clock signal $F_{REF}$ significantly lags the divided clock signal $F_{DIV}$, the summed output $TDC_{OUT}$ is zero, since the reference clock signal $F_{REF}$ has not transitioned high when flip-flops 338 have been clocked. On the other hand, when reference clock signal $F_{REF}$ significantly leads the divided clock signal $F_{DIV}$, the summed output $TDC_{OUT}$ is three. As the reference clock signal $F_{REF}$ comes closer in phase with divided clock signal $F_{DIV}$, summed output $TDC_{OUT}$ of one or two are possible. In this manner, TDC 304 illustrated in FIG. 3B digitizes the phase difference between reference clock signal $F_{REF}$ and divided clock signal $F_{DIV}$. The size of the LSB of the quantization is related to the delay difference (e.g., $\tau_1$ and $\tau_2$) between delay blocks 332, 334 and 336. It should be understood that while three delay blocks 332, 334 and 336 are shown for simplicity of illustration, any number of delay blocks could be provided. In some embodiments, delay differences $\tau_1$ and $\tau_2$ between delay blocks 332, 334 and 336 may be calibrated using delay calibration techniques known in the art. It should be appreciated that TDC 304 depicted in FIG. 3B is just one of many possible TDC circuits that could be used to implement TDCs used in PLLs according to embodiments of the present invention. In alternative embodiments, other TDC circuits known in the art could be used.

Figure 3C:
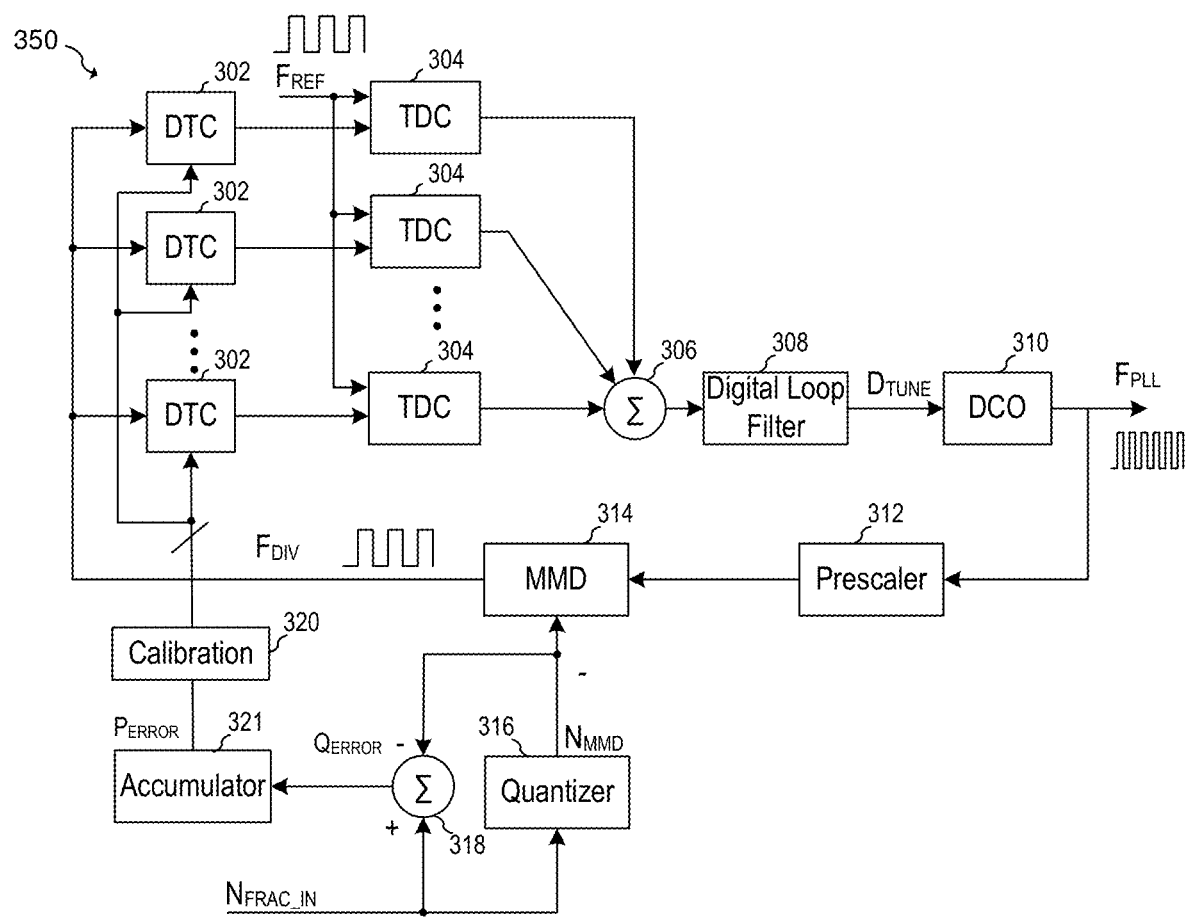
FIGS. 3C, 3D, 3E and 3F illustrate all-digital PLLs according to further embodiments.

FIG. 3C illustrates ADPLL 350 according to an alternative embodiment of the present invention. ADPLL 350 is similar to ADPLL 300 shown in FIG. 3A with the exception that DTCs 302 are configured to delay divided clock $F_{DIV}$ instead of reference clock $F_{REF}$. In the embodiment of FIG. 3C, more delay is provided by DTCs 302 when quantization error signal $P_{ERROR}$ indicates that the MMD output $F_{DIV}$ has a lower delay than $F_{REF}$, and less delay is provided by DTCs 302 when quantization error signal $P_{ERROR}$ indicates that the MMD output $F_{DIV}$ has a larger delay division ratio than $F_{REF}$.

Figure 3D:
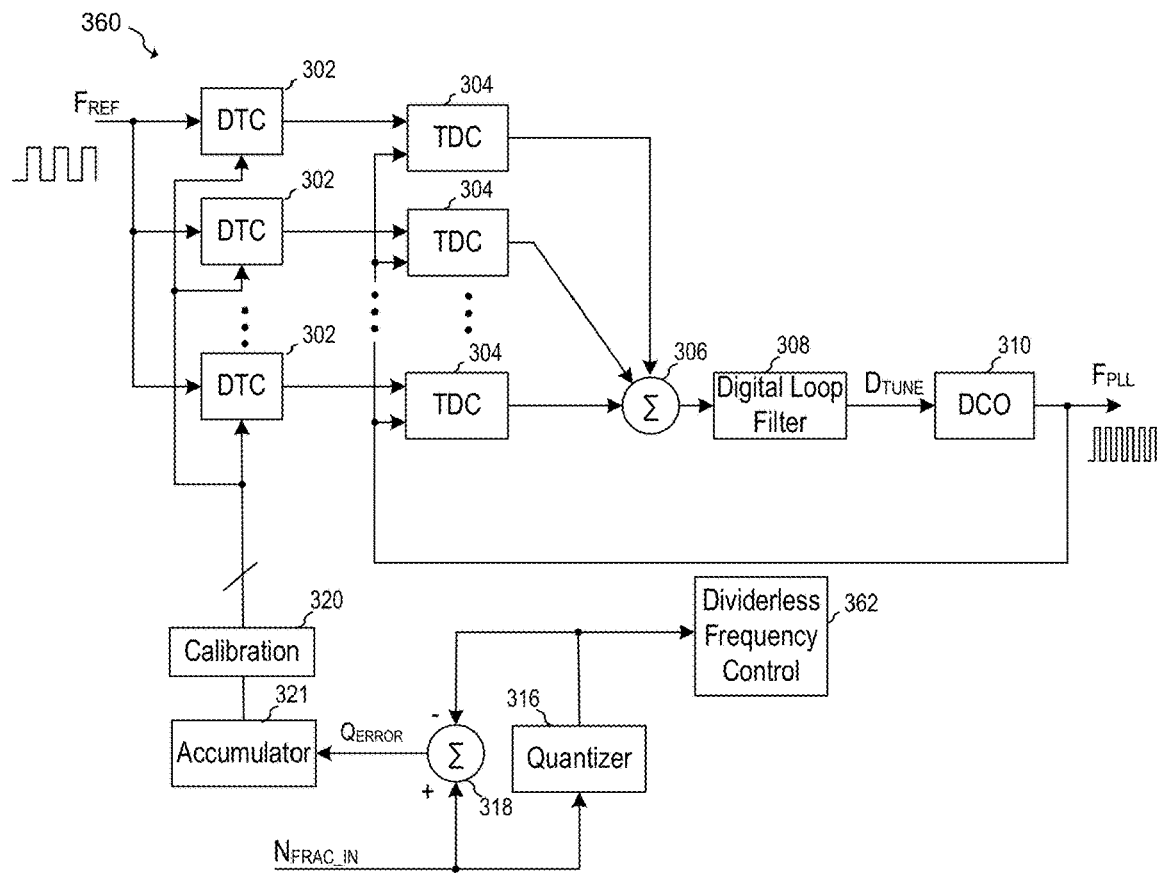

Embodiment concepts may be directed to dividerless fractional-N PLLs as illustrated, for example, in FIG. 3D showing dividerless fractional-N PLL 360 according to a further embodiment. As shown, dividerless fractional-N PLL 360 differs from ADPLL 300 shown in FIG. 3A in that the output $F_{PLL}$ of DCO 310 is provided to TDCs 304 without being divided. Instead, the output frequency is adjusted using dividerless frequency control block 362 that is configured to apply dividerless frequency control methods known in the art. For example, dividerless frequency control block 362 may be configured to adjust the frequency or the phase of the DCO by switching a tuning capacitor bank of the DCO, by selecting a phase from a ring oscillator, applying an adjustable delay to the output of DCO 310, selecting a tap from a programmable delay line coupled between DCO 310 and TDC's 304, or other dividerless frequency adjustment techniques known in the art. In embodiments in which dividerless frequency control block 362 is configured to apply adjust the frequency of $F_{PLL}$ by a quantized value, further resolution may be achieved by using quantizer 316 and using phase error signal $P_{ERROR}$ to adjust the delay of DTCs 302 as described in embodiments above. While dividerless fractional-N PLL 360 is shown having DTCs 302 configured to delay reference clock $F_{REF}$, in alternative embodiments, DTCs may be configured to delay output clock $F_{PLL}$ instead as is shown in FIG. 3C.

Figure 3E:
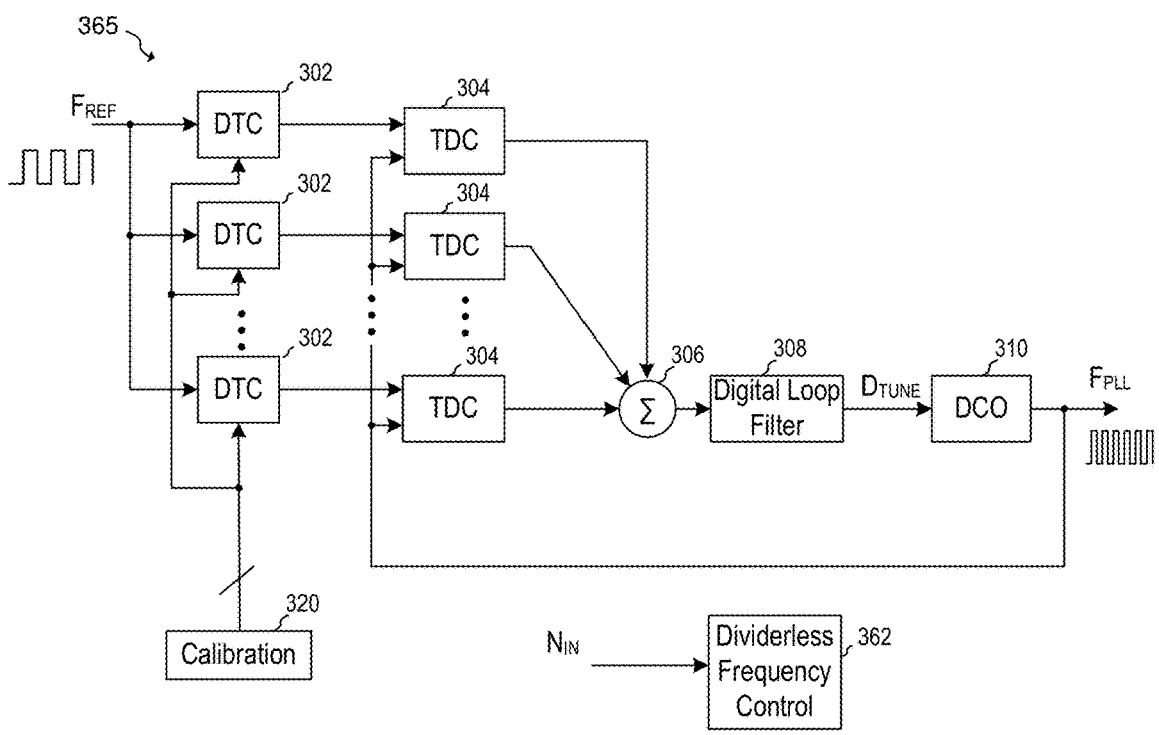

In a further embodiment, a dividerless integer-N PLL may also be implemented as shown in FIG. 3E, which illustrates dividerless integer-N PLL 365 according to an embodiment. Dividerless integer-N PLL 365 is similar to dividerless fractional-N PLL shown in FIG. 3D, with the exception that quantizer 316, summer 318, and accumulator 321 that supports fractional-N operation has been omitted.

Figure 3F:
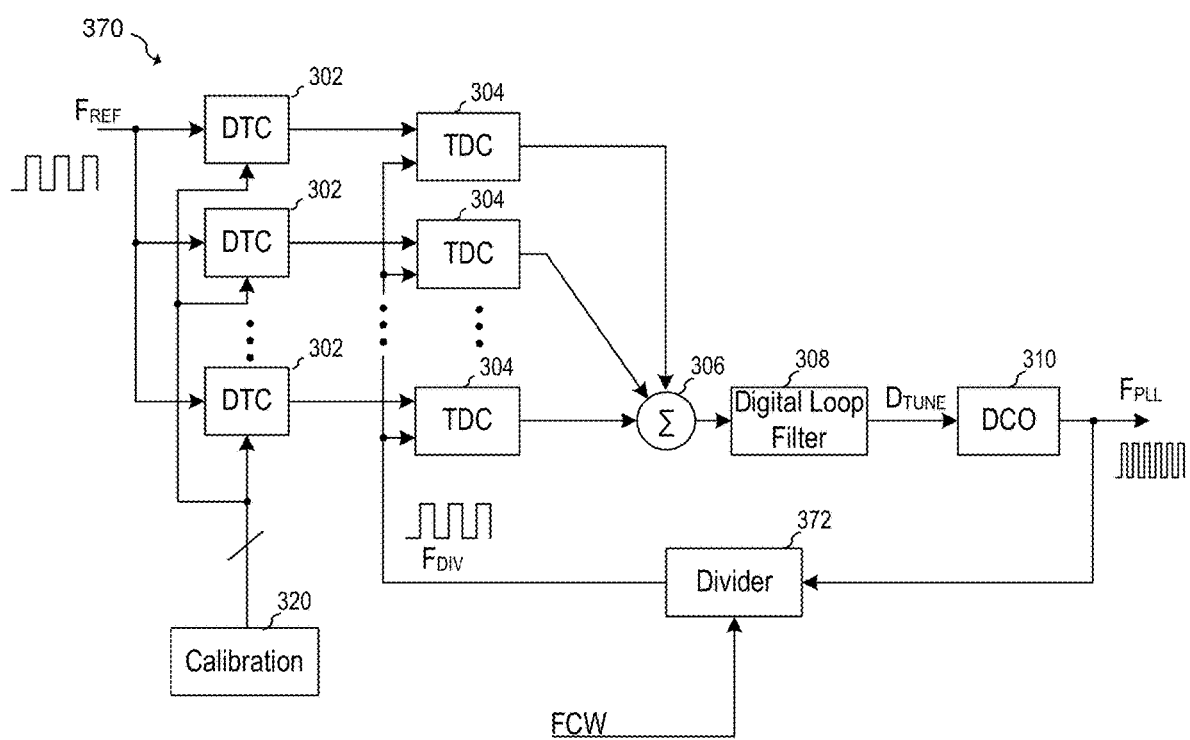

FIG. 3F illustrates an embodiment ADPLL 370 that includes a programmable integer divider 372 in the feedback path. In an embodiment, integer divider 372 is configured to divide output clock $F_{PLL}$ by an integer set by divider control signal FCW. While ADPLL 370 is shown having DTCs 302 configured to delay reference clock $F_{REF}$, in alternative embodiments, DTCs may be configured to delay output clock $F_{PLL}$ instead as is shown in FIG. 3C.

It should be appreciated that some details have been omitted from FIGS. 3A-3F for the purpose of simplicity of illustration. For example, in some embodiments, the outputs of TDCs 304 may be coupled to calibration circuit 320. Such coupling is conceptually described below with respect to FIGS. 4A and 4B which shows the output of TDC 403 coupled to LMS calibration block 402.

Figure 4A:
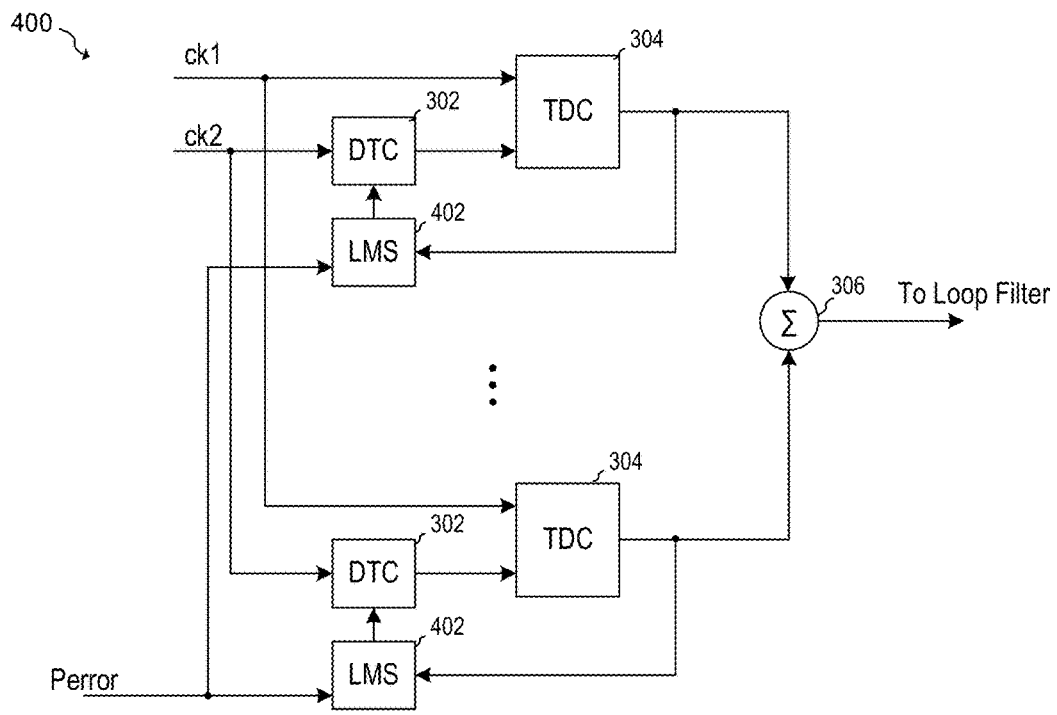
FIG. 4A and FIG. 4B illustrate block diagrams of embodiment calibration circuitry together with embodiment phase detection signal paths.

In an embodiment, the DTC 302 of each phase detection signal path may be separately calibrated in order to equalize the relative delays between each phase detection signal path and to equalize the effect of phase error signal $P_{ERROR}$ on the delay provided by DTC for each phase detection signal path. FIG. 4A illustrates a detailed view 400 of two phase detection signal paths of an embodiment PLL that is representative of the phase detection signal paths of ADPLL 300 and 350 depicted in FIGS. 3A, 3C, 3D, 3E and 3F and discussed above. As shown, each phase detection signal path includes a DTC 302 and a TDC 304. The input clocks to each phase detection signal path is generally denoted as ck1 and ck2, as either reference clock $F_{REF}$ could be coupled to DTC 302 (as shown in FIGS. 3A, 3D, 3E and 3F) or divided clock $R_{DIV}$ could be coupled to DTC 302 (as shown in FIG. 3C). In addition to DTC 302 and TDC 304, each phase detection signal path also includes a least-means square (LMS) calibration block 402 coupled to DTC 302. LMS calibration blocks 402 may collectively implement the function of calibration circuit 320 shown in FIGS. 3A and 3C. In an embodiment, each LMS calibration block 402 is configured to map phase error signal $P_{ERROR}$ to a corresponding calibrated delay that is applied to clock signal ck2.

Figure 4B:
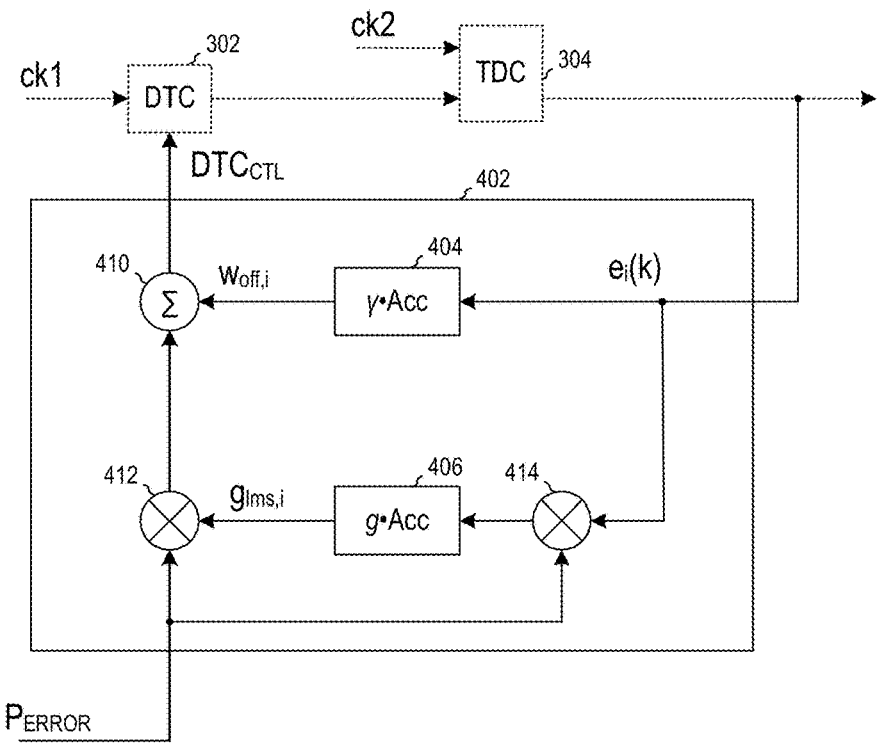

FIG. 4B illustrates a block diagram showing one possible implementation of LMS block 402 configured to provide background calibration of a gain an offset applied to phase error signal $P_{ERROR}$ in order to generate a control signal $DTC_{CTL}$ for DTC 302. As shown LMS block 402 includes accumulators 404 and 406, multipliers 412 and 414 and summer 410. In an embodiment, accumulator 404 accumulates output $e_i(k)$ of TDC 304 to produce offset correction signal $w_{off,i}$, which is added to phase error signal $P_{ERROR}$ via summer 410. Gain correction signal $g_{lms,i}$ is produced by multiplying output $e_i(k)$ of TDC 304 by phase error signal $P_{ERROR}$ using multiplier 414 and accumulating the multiplied signal using accumulator 406. Multiplier 412 multiples phase error signal $P_{ERROR}$ by gain correction signal $g_{lms,i}$ in order to correct the gain of DTC 302 with respect to phase error signal $P_{ERROR}$. As shown accumulator 404 has a calibrated gain factor of $\gamma$ and accumulator 406 has a calibrated gain factor g, which may be updated in the background using an LMS algorithm. In embodiments in which quantizer 316 is not used, such as in the embodiment of FIG. 3F that includes a fixed divider, multipliers 412 and 414, accumulator 406 and summer 410 may be omitted. In such embodiments, the output of accumulator 404 may be connected to the control input $DTC_{CTL}$ of DTC 302.

In embodiments of the present invention, the LMS algorithm determines an error metric that describes the difference or variance of outputs $e_i(k)$ of each of the TDCs 304 of each phase detection signal path. This error metric could be a variance, a mean-squared error between the various outputs $e_i(k)$, or any other suitable error metric. During operation the PLL, this error metric is monitored and variables of γ and g are updated to reduce and/or minimize the error metric using LMS methods known in the art. By updating these values, the gain and offset of phase error signal $P_{ERROR}$ are calibrated in a manner that the relative delays of each phase detection signal path are substantially matched over a usable range of phase error signal $P_{ERROR}$. Since the output of quantizer 316 that helps generate phase error signal $P_{ERROR}$ is frequently varying signal, multiplying $e_i(k)$ by phase error signal $P_{ERROR}$ can be configured to provide sufficient signal activity to ensure that the gain calibration path is exercised during background calibration. In this respect, phase error signal $P_{ERROR}$ acts as a training sequence or dither signal with respect to the background calibration algorithm.

LMS block 402 may be implemented using digital circuitry know in the art. For example, summer 410 can implemented using a digital adder, multipliers 412 and 414 can be implemented using digital multipliers, and accumulators 404 and 406 may be implemented using accumulator circuits (such as an adder coupled to a register) known in the art. In some embodiments, calibration factors γ and g are applied to the input or the output of accumulators 404 and 406 using a digital multiplier and/or a shift register. In alternative embodiments, LMS block 402 may be implemented using a programmable processor, such as a microcontroller or a microprocessor, or a digital signal processor (DSP). LMS block 402 may be controlled using a controller (not shown) implemented digital circuitry and/or programmable processors known in the art.

It should be understood that the implementation of LMS block 402 depicted in FIG. 4B represents one of many ways that the relative delays of DTC blocks 302 can be implemented. In alternative embodiments, other calibration methods such as other stochastic gradient methods, steepest descent methods, recursive least squares (RLS), or any foreground calibration aiming to find a $DTC_{CTL}$ sequence that cancels, on one hand, the delay mismatch between the DTCs 302 and TDCs 304 in FIG. 4A and, on the other hand, the quantization noise $P_{ERROR}$ could also be used.

Figure 5A:
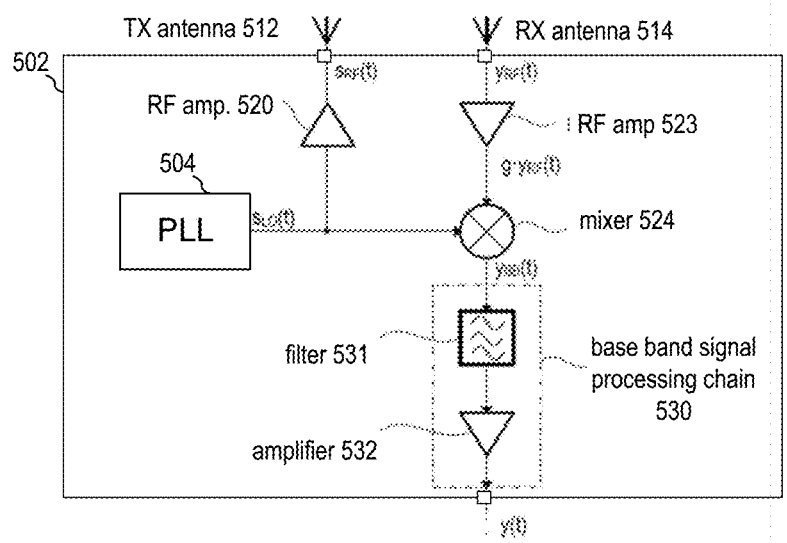
FIGS. 5A and 5B illustrate block diagrams of RF systems that incorporate PLLs according to embodiments.

FIG. 5A illustrates an embodiment radar transceiver 502 that utilizes an embodiment PLL as described according to the various embodiments described above. As shown, radar transceiver includes embodiment PLL 504 that generates an RF signal $s_{LO}(t)$, which may be frequency-modulated using frequency modulation techniques know in the art. For example, in a frequency modulated continuous wave (FMCW) radar system, RF signal $s_{LO}(t)$ may be frequency modulated to have a frequency ramp of increasing and/or decreasing frequency. Alternatively, RF signal $s_{LO}(t)$ may be frequency modulated according to other shapes and patterns, such as rectangular and sinusoidal. In radar applications, the LO signal may be in the Super High Frequency (SHF) or the Extremely High Frequency (EHF) band (e.g., between 76 GHz and 81 GHz in automotive applications).

The LO signal $s_{LO}(t)$ is processed in the transmit signal path as well as in the receive signal path. The transmit signal $s_{RF}(t)$, which is radiated by the TX antenna 512, is generated by amplifying the LO signal $s_{LO}(t)$, for example, using an RF power amplifier 520. The output of the amplifier 520 is coupled to the TX antenna 512. The received signal $y_{RF}(t)$, which is provided by the RX antenna 514, is provided to a mixer 524. In the present example, the received signal $y_{RF}(t)$ (i.e., the antenna signal) is pre-amplified by RF amplifier 523 (gain g), so that the mixer receives the amplified signal $g \cdot y_{RF}(t)$ at its RF input. The mixer 524 further receives the LO signal $s_{LO}(t)$ at its reference input and is configured to down-convert the amplified signal $g \cdot y_{RF}(t)$ into the base band. The resulting base-band signal at the mixer output is denoted as $y_{BB}(t)$. The base-band signal $y_{BB}(t)$ is further processed by the analog base band signal processing chain 530, which basically includes one or more filters (e.g., a band-pass filter 531) to remove undesired side bands and image frequencies as well as one or more amplifiers such as amplifier 532. The analog output signal, which may be supplied to an analog-to-digital converter is denoted as y(t). radar transceiver 502.

In the present example, the mixer 524 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). It should be understood that radar transceiver 502 is just one of many possible systems that may utilized PLLs according to embodiments of the present invention.

Figure 5B:
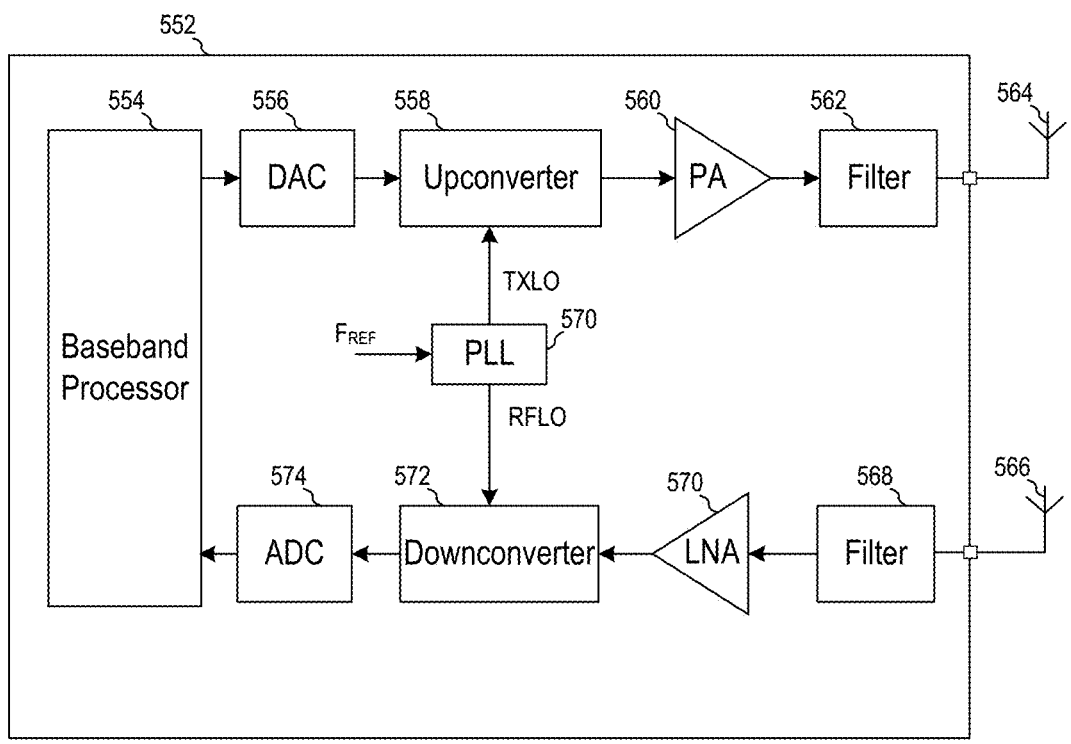

FIG. 5B illustrates an embodiment RF transceiver 552 that utilizes an embodiment PLL as described according to the various embodiments above. RF transceiver 502 may be used, for example, in an RF communication system. As shown, RF transceiver 552 includes a baseband processor 554 that is coupled to a transmit signal path and a receive signal path. The transmit signal path includes a digital-to-analog converter (DAC) 556, upconverter 558, power amplifier 560 transmit filter 562 that may be coupled to transmit antenna 564. The receive signal path includes an analog-to-to digital converter (ADC) 574, downconverter 572, low noise amplifier (LNA) 670 and receive filter 568 that may be coupled to a receive antenna 566. PLL 570, which may be implemented using a PLL circuit according to any of the embodiments described herein, is configured to provide a transmit local oscillator signal TXLO to upconverter 558 of the transmit signal path, and a receive local oscillator signal RXLO to downconverter 572 of the receive signal path. In the illustrated embodiment a single PLL 570 that derives signals TXLO and RXLO from reference signal $F_{REF}$ is shown, which may be suitable for half-duplex transmission and reception. In an alternative embodiment, two separate embodiment PLLs could be used, for example, to implement a full-duplex RF transceiver.

During operation, baseband processor 554 generates a baseband signal in the digital domain, which is converted to the analog domain using digital-to-analog converter (DAC) 556 to form an analog baseband signal. DAC 556 may be implemented using DAC circuits known in the art. The analog baseband signal is upconverted to an RF frequency using upconverter 558, which may be implemented, for example, using one or more RF mixing circuits. The output of the upconverter is amplified using embodiment power amplifier 560, and the resulting amplified RF signal is filtered using transmit filter 562 and provided to transmit antenna 564. Transmit filter 562 may be implemented using RF filter circuits and systems known in the art including, but not limited to passive LC filters, surface acoustic wave (SAW) filters.

The receive signal path includes an analog-to-to digital converter (ADC) 574, downconverter 572, low noise amplifier (LNA) 570 and receive filter 568 that may be coupled to a receive antenna 566. During operation, receive filter 568 filters an RF signal received by receive antenna 566, The filtered received signal is filtered by LNA 570, the output of which downconverted by downconverter 572. The downconverted analog signal is digitized by ADC 547, and the digitized output is processed by baseband processor 554. Receive filter 568 may be implemented RF filter circuits and systems known in the art including, but not limited to passive LC filters, surface acoustic wave (SAW) filters; downconverter 572 may by implemented using downconverter circuits and systems known in the art, such as one or more RF mixer circuits, and ADC 574 may be implemented using ADC circuits known in the art.

In some embodiments, all of the circuitry of RF transceiver 552 may be implemented on a single monolithic semiconductor integrated circuit. Alternatively, the components of RF transceiver 552 may be partitioned using multiple components. It should be understood that RF transceiver 552 is just one of many systems that may utilize power amplifiers according to embodiments of the present invention.

Figure 6:
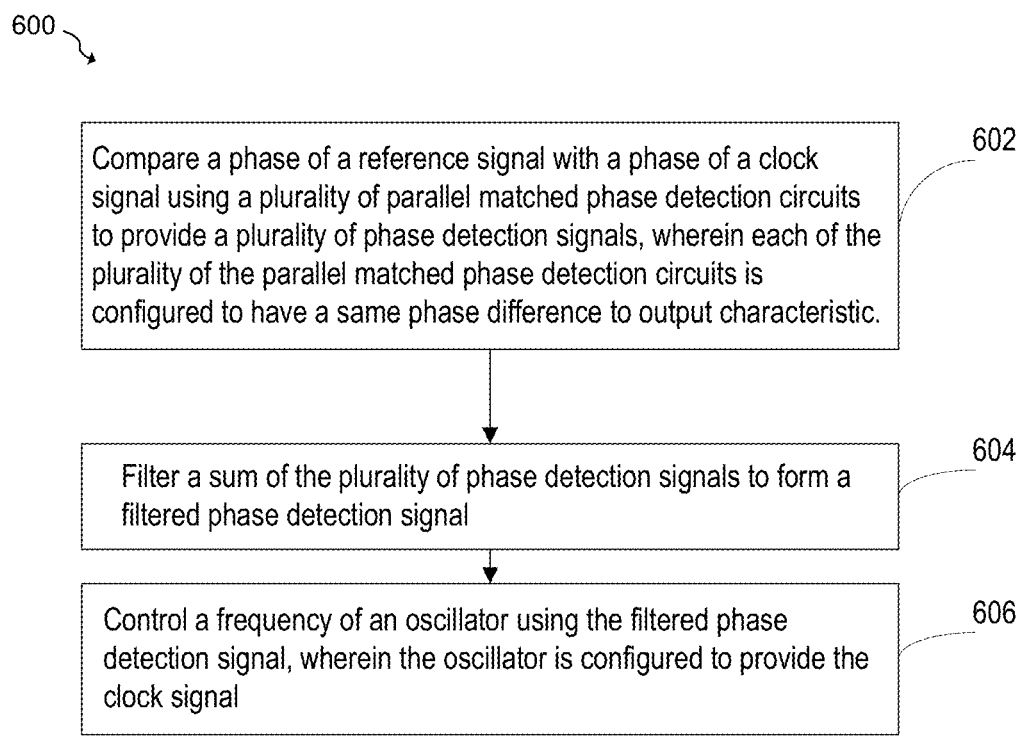
FIG. 6 illustrates a block diagram of a method according to an embodiment.

FIG. 6 illustrates a block diagram of a method 600 according to an embodiment of the present invention. Method 600 may be performed by any of the PLL systems described in embodiments above. In step 602, A phase of a reference signal is compared with a phase of a clock signal using a plurality of parallel matched phase detection circuits to provide a plurality of phase detection signals. Each of the plurality of the parallel matched phase detection circuits is configured to have a same phase difference to output characteristic. In analog embodiments, such as the embodiment of FIG. 1, the plurality of phase detectors may be implemented using PFDs. In digital embodiments, such as the embodiments of FIGS. 3A to 3F the plurality of phase detectors may be implemented using time-to-digital converters.

In step 604, a sum of the plurality of phase detection signals are filtered to form a filtered phase detection signal. This filtering may be performed using an analog or digital filter depending on the configuration of the particular system.

In step 606, a frequency of an oscillator is controlled using the filtered phase detection signal. In various embodiments the oscillator is configured to provide the clocked signal. In some embodiments, this clock signal may be divided using a divider as shown in the embodiments of FIGS. 1A, 2A, 3A, 3C, and 3F. Alternatively, the clock may be undivided as shown in the embodiment of FIG. 3D.

Embodiments of the present invention are summarized here. Other embodiments can also be understood from the entirety of the specification and the claims filed herein.

Example 1. A method of operating a phase locked loop (PLL), the method including: comparing a phase of a reference signal with a phase of a clock signal using a plurality of parallel matched phase detection circuits to provide a plurality of phase detection signals, where each of the plurality of the parallel matched phase detection circuits is configured to have a same phase difference to output characteristic; filtering a sum of the plurality of phase detection signals to form a filtered phase detection signal; and controlling a frequency of an oscillator using the filtered phase detection signal, where the oscillator is configured to provide the clock signal.

Example 2. The method of example 1, where: each of the plurality of parallel matched phase detection circuits includes a phase-frequency detector (PFD) and a charge pump coupled to an output the PFD; and filtering the sum of the plurality of phase detection signals includes using an analog loop filter.

Example 3. The method of one of examples 1 or 2, where: each of the parallel matched phase detection circuits includes a time-to-digital converter; and filtering the sum of the plurality of phase detection signals includes using a digital loop filter.

Example 4. The method of one of examples 1 to 3, further including:

Example 5. The method of one of examples 1 to 4, further including: applying a fractional division value to an input of a quantizer; and controlling a division ratio of the divider with an output of the quantizer.

Example 6. The method of example 4 or 5, further including; determining a quantization error of the quantizer; and delaying the reference signal or the divided clock signal by a delay time based on the determined quantization error prior to comparing the phase.

Example 7. The method of example 6, where delaying the reference signal or the divided clock signal includes using a plurality of parallel digital-to-time converters coupled to corresponding inputs of the plurality of parallel matched phase detection circuits.

Example 8. A phase locked loop (PLL) including: a plurality of parallel matched phase detection circuits, each of the plurality of parallel matched phase detection circuits including a first input coupled to a reference signal node, a second input coupled to a clock signal node, and an output configured to provide a respective phase detection signal, where each of the plurality of the parallel matched phase detection circuits is configured to have a same phase difference to output characteristic; a loop filter coupled to outputs of the plurality of parallel matched phase detection circuits; and an oscillator having a frequency control input coupled to an output of the loop filter, where the oscillator is configured to provide a clock signal.

Example 9. The PLL of example 8, where: each of the plurality of parallel matched phase detection circuits includes a phase-frequency detector (PFD) and a charge pump coupled to an output the PFD; and the loop filter includes an analog filter.

Example 10. The PLL of one of examples 8 or 9, where; each of the parallel matched phase detection circuits includes a time-to-digital converter; and the loop filter includes a digital filter.

Example 11. The PLL of example 10, where the time-to-digital converter is configured to provide a multi-bit output.

Example 12. The PLL of one of examples 8 to 11, further including a clock divider configured to receive the clock signal and to provide a divided clock signal to the clock signal node.

Example 13. The PLL of example 12, further including a quantizer coupled between a fractional division input and a modulo control input of the clock divider.

Example 14. The PLL of example 13, further including: a quantization error determination circuit coupled to the quantizer, the quantization error determination circuit configured to provide a determined quantization error value of the quantizer; and a digital-to-time converter coupled between the reference signal node and the first input of each of the plurality of parallel matched phase detection circuits, or coupled between an output of the clock divider and the second input each phase of the plurality of parallel matched phase detection circuits, the digital-to-time converter configured to provide a first delay to a reference signal at the reference signal node or to the divided clock signal at the output of the clock divider based on the determined quantization error value.

Example 15. The PLL of example 14, where the digital-to-time converter includes a plurality of parallel digital-totime converters coupled to corresponding first inputs or second inputs of the plurality of parallel matched phase detection circuits.

Example 16. The PLL of example 15, further including a calibration circuit configured to independently calibrate a relationship between the first delay and the determined quantization error value for each of the plurality of parallel digital-to-time converters.

Example 17. A phase locked loop (PLL) including: a plurality of phase detection signal paths coupled in parallel, each phase detection signal path including a digital-to-time converter and a time-to-digital converter having an input coupled to an output of the digital-to-time converter, where each of the plurality of phase detection signal paths are configured to apply a same phase detection characteristic to a phase difference between a reference signal and a divided clock signal; a summing circuit coupled to outputs of each of the plurality of phase detection signal paths; a digital loop filter coupled to an output of the summing circuit; a digitally controlled oscillator (DCO) coupled to an output of the digital loop filter; a divider coupled between an output of the DCO and the plurality of phase detection signal paths, the divider configured to provide the divided clock signal; a delta-sigma modulator having an output coupled to modulo control input of the divider; and a subtraction circuit having input coupled to an input of the delta-sigma modulator and the output of the delta-sigma modulator and an output coupled to a delay control input of each digital-to-time converter of the plurality of phase detection signal paths.

Example 18. The PLL of example 17, further including a calibration circuit configured to independently calibrate a relationship between values provided to the delay control input of each digital-to-time converter and a delay provided by each digital-time converter of the plurality of phase detection signal paths.

Example 19. The PLL of one of examples 17 or 18, where the digital-to-time converter of each of the plurality of phase detection signal paths includes an input configured to receive the reference signal.

Example 20. The PLL of one of examples 17 to 19, where the digital-to-time converter of each of the plurality of phase detection signal paths includes an input configured to receive the divided clock signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a phase locked loop (PLL), the method comprising:
    comparing a phase of a reference signal with a phase of a clock signal using a plurality of parallel matched phase detection circuits to provide a plurality of phase detection signals, wherein each of the plurality of the parallel matched phase detection circuits is configured to have a same phase difference to output characteristic;
    filtering a sum of the plurality of phase detection signals to form a filtered phase detection signal; and
    controlling a frequency of an oscillator using the filtered phase detection signal, wherein the oscillator is configured to provide the clock signal.

2. The method of claim 1, wherein:
    each of the plurality of parallel matched phase detection circuits comprises a phase-frequency detector (PFD) and a charge pump coupled to an output the PFD; and
    filtering the sum of the plurality of phase detection signals comprises using an analog loop filter.

3. The method of claim 1, wherein:
    each of the parallel matched phase detection circuits comprises a time-to-digital converter; and
    filtering the sum of the plurality of phase detection signals comprises using a digital loop filter.

4. The method of claim 1, further comprising:
    dividing the frequency of the oscillator to form a divided clock signal, wherein dividing the frequency of the oscillator comprises using a divider coupled to an output of the oscillator.

5. The method of claim 4, further comprising:
    applying a fractional division value to an input of a quantizer; and
    controlling a division ratio of the divider with an output of the quantizer.

6. The method of claim 5, further comprising:
    determining a quantization error of the quantizer; and
    delaying the reference signal or the divided clock signal by a delay time based on the determined quantization error prior to comparing the phase.

7. The method of claim 6, wherein delaying the reference signal or the divided clock signal comprises using a plurality of parallel digital-to-time converters coupled to corresponding inputs of the plurality of parallel matched phase detection circuits.

8. A phase locked loop (PLL) comprising:
    a plurality of parallel matched phase detection circuits, each of the plurality of parallel matched phase detection circuits comprising a first input coupled to a reference signal node, a second input coupled to a clock signal node, and an output configured to provide a respective phase detection signal, wherein each of the plurality of the parallel matched phase detection circuits is configured to have a same phase difference to output characteristic;
    a loop filter coupled to outputs of the plurality of parallel matched phase detection circuits; and
    an oscillator having a frequency control input coupled to an output of the loop filter, wherein the oscillator is configured to provide a clock signal.

9. The PLL of claim 8, wherein:
    each of the plurality of parallel matched phase detection circuits comprises a phase-frequency detector (PFD) and a charge pump coupled to an output the PFD; and
    the loop filter comprises an analog filter.

10. The PLL of claim 8, wherein:
    each of the parallel matched phase detection circuits comprises a time-to-digital converter; and
    the loop filter comprises a digital filter.

11. The PLL of claim 10, wherein the time-to-digital converter is configured to provide a multi-bit output.

12. The PLL of claim 8, further comprising a clock divider configured to receive the clock signal and to provide a divided clock signal to the clock signal node.

13. The PLL of claim 12, further comprising a quantizer coupled between a fractional division input and a modulo control input of the clock divider.

14. The PLL of claim 13, further comprising:
a quantization error determination circuit coupled to the quantizer, the quantization error determination circuit configured to provide a determined quantization error value of the quantizer; and
a digital-to-time converter coupled between the reference signal node and the first input of each of the plurality of parallel matched phase detection circuits, or coupled between an output of the clock divider and the second input each phase of the plurality of parallel matched phase detection circuits, the digital-to-time converter configured to provide a first delay to a reference signal at the reference signal node or to the divided clock signal at the output of the clock divider based on the determined quantization error value.

15. The PLL of claim 14, wherein the digital-to-time converter comprises a plurality of parallel digital-to-time converters coupled to corresponding first inputs or second inputs of the plurality of parallel matched phase detection circuits.

16. The PLL of claim 15, further comprising a calibration circuit configured to independently calibrate a relationship between the first delay and the determined quantization error value for each of the plurality of parallel digital-to-time converters.

17. A phase locked loop (PLL) comprising:
a plurality of phase detection signal paths coupled in parallel, each phase detection signal path comprising a digital-to-time converter and a time-to-digital converter having an input coupled to an output of the digital-to-time converter, wherein each of the plurality of phase detection signal paths are configured to apply a same phase detection characteristic to a phase difference between a reference signal and a divided clock signal;
a summing circuit coupled to outputs of each of the plurality of phase detection signal paths;
a digital loop filter coupled to an output of the summing circuit;
a digitally controlled oscillator (DCO) coupled to an output of the digital loop filter;
a divider coupled between an output of the DCO and the plurality of phase detection signal paths, the divider configured to provide the divided clock signal;
a delta-sigma modulator having an output coupled to modulo control input of the divider; and
a subtraction circuit having input coupled to an input of the delta-sigma modulator and the output of the delta-sigma modulator and an output coupled to a delay control input of each digital-to-time converter of the plurality of phase detection signal paths.

18. The PLL of claim 17, further comprising a calibration circuit configured to independently calibrate a relationship between values provided to the delay control input of each digital-to-time converter and a delay provided by each digital-time converter of the plurality of phase detection signal paths.

19. The PLL of claim 17, wherein the digital-to-time converter of each of the plurality of phase detection signal paths comprises an input configured to receive the reference signal.

20. The PLL of claim 17, wherein the digital-to-time converter of each of the plurality of phase detection signal paths comprises an input configured to receive the divided clock signal.

* * * * *